United States Patent [19]

Papay

[11] 3,725,800

[45] Apr. 3, 1973

[54] AGC NETWORK

[75] Inventor: Joseph Papay, Kitchener, Ontario, Canada

[73] Assignee: Electrohome Limited, Kitchener, Ontario, Canada

[22] Filed: Sept. 7, 1971

[21] Appl. No.: 178,031

[52] U.S. Cl. ....................................330/29, 330/145

[51] Int. Cl. ................................................H03g 3/30

[58] Field of Search .........330/29, 145; 325/319, 413

[56] References Cited

UNITED STATES PATENTS 3,115,601 12/1963 Harris..............................330/145 X 3,446,987 5/1969 Ito....................................330/145 X

*Primary Examiner*—Roy Lake

*Assistant Examiner*—James B. Mullins

*Attorney*—Sim & McBurney

[57] ABSTRACT

An AGC network connected between the input and output terminals of an amplifier avoids distortion and yet permits the preamplifier to provide a high level output signal. A part of the output signal of the amplifier is rectified, filtered and applied to a transistor to develop in its output circuit two D.C. signals that are applied to the base-emitter junctions of two transistors of opposite conductivity types that shunt the input terminal of the amplifier.

6 Claims, 4 Drawing Figures

Joseph Papay

INVENTOR.

BY

Agent

Joseph Papay
INVENTOR.

BY [signature]

Agent

AGC NETWORK

This invention relates to automatic gain control (AGC) networks.

A conventional AGC network of the type that will be described at a later point herein operates satisfactorily as long as the output signal of the preamplifier of a preamplifieramplifier combination is at a relatively low level. Unfortunately, however, the best signal to noise ratio results when the gain of the preamplifier is high and the gain of the amplifier is low. Any attempt to improve the signal to noise ratio by increasing the gain of the preamplifier introduces, via the AGC network, distortion of the signal at the input terminal of the amplifier.

In accordance with this invention there is provided an AGC network that overcomes the foregoing problem.

In brief, an AGC network is provided that includes two transistors of opposite conductivity types shunting the input terminal of the amplifier, means for rectifying a part of the output signal of the amplifier and means for deriving from the rectified signal and for applying to the input terminals of respective ones of said transistors signals which simultaneously vary the conductivities of the transistors in the same direction and to the same degree.

This invention will become more apparent from the following detailed description, taken in conjunction with the appended drawings, in which.

Figure 1:
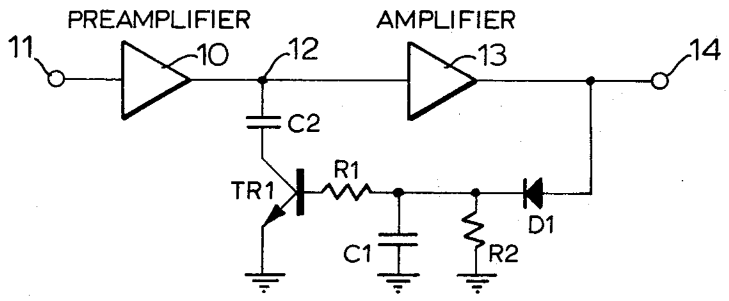
FIG. 1 (PRIOR ART)
FIG. 1 shows a prior art AGC network of the type referred to hereinbefore.

Referring now to FIG. 1, there is shown a preamplifier 10 having an input terminal 11 to which input signals are applied and an output terminal 12 at which output signals are derived. The output terminal and output signal of preamplifier 10 are the input terminal and input signal respectively of an amplifier 13 having an output terminal 14 at which output signals are derived. Connected between output terminal 14 and input terminal 12 of amplifier 13 is an AGC network consisting of a diode D1, a filter capacitor C1, a transistor TR1, a current limiting resistor R1 for protection of the transistor, a resistor R2 that provides a path for the discharge of capacitor C1, and a coupling capacitor C2.

Figure 2:
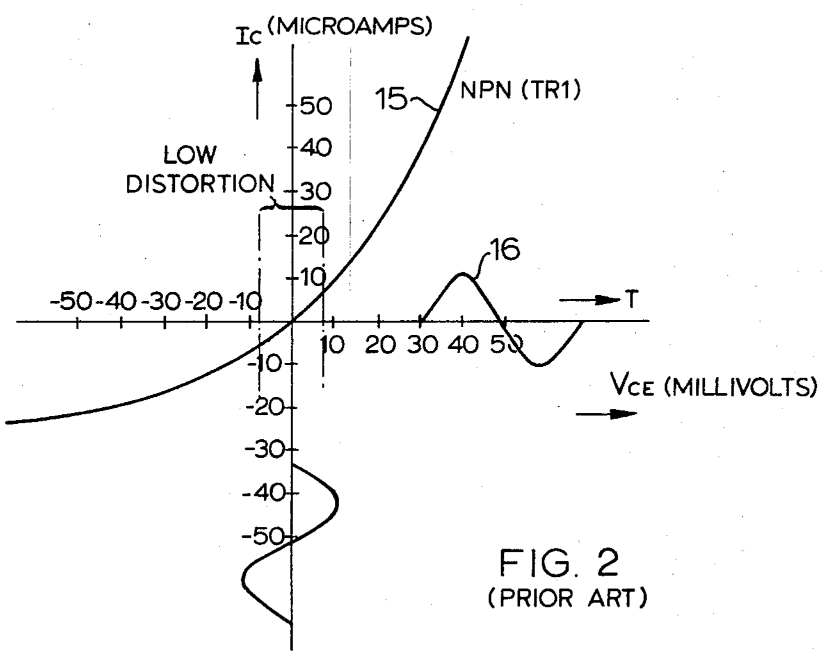
FIG. 2 (PRIOR ART)
FIG. 2 shows the characteristic curve of the collector-emitter junction of the transistor of FIG. 1.

In operation a part of the output signal of amplifier 13 is rectified by diode D1 and filtered by capacitor C1. The resultant D.C. signal varies the conductivity and hence resistance of transistor TR1. Any increases in signal strength beyond a predetermined level are compensated for by the attenuating effect of AGC network. Satisfactory operation is achieved as long as the gain of preamplifier 10 is low. However, if the gain of the preamplifier is increased to increase the signal to noise ratio, distortion results from the non-linearity of transistor TR1. This is shown in FIG. 2 where 15 designates the characteristic curve of the collector-emitter junction of transistor TR1 and 16 is the distorted signal in the collector-emitter circuit of transistor TR1.

Figure 3:
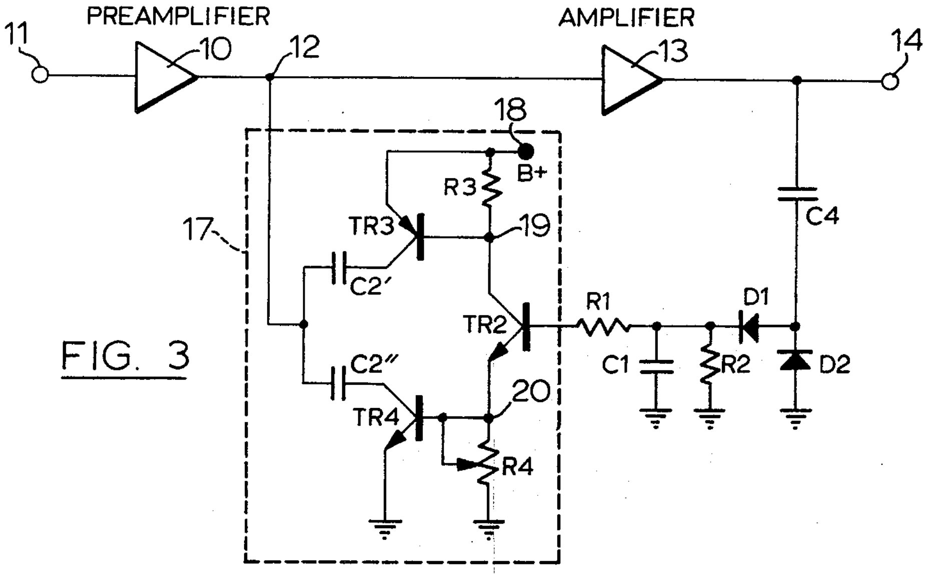
FIG. 3 shows an AGC network embodying this invention.

Referring now to FIG. 3, in accordance with a preferred embodiment of this invention, transistor TR1 of FIG. 1 is replaced by the network within the dotted lines 17. This network includes three transistors TR2, TR3 and TR4, two resistors R3 and R4, the latter being variable and two equal coupling capacitors C2′ and C2″.

Resistor R3 is connected between one terminal 18 of a source of D.C. potential (not shown) and the collector of transistor TR2. Resistor R4 can be adjusted to be of the same magnitude as resistor R3 and is connected between the emitter of transistor TR2 and the other (grounded) terminal of the source of D.C. potential.

The collector and emitter of transistor TR2 are connected to the bases of transistors TR3 and TR4 respectively. These transistors are a matched pair but are of opposite conductivity types. The emitter of transistor TR3 is connected to terminal 18, and the emitter of transistor TR4 is grounded. The collectors of transistors TR3 and TR4 are coupled via capacitors C2′ and C2″ to terminal 12.

The circuit shown in FIG. 3 differs from that of FIG. 1 in that diode D1 of FIG. 1 has been replaced with a voltage doubler that includes capacitors C1 and C4 and diodes D1 and D2, but this is not essential to the invention in any way.

In operation, a part of the output signal of amplifier 13 is rectified by the voltage doubler network and filtered by capacitor C1. The resultant D.C. signal that varies with the output signal of the amplifier is applied to the base of transistor TR2. Assuming that transistors TR3 and TR4 are perfectly matched, resistor R4 is adjusted so that resistors R3 and R4 will have equal resistances. The D.C. voltages developed across resistors R3 and R4 then will be substantially equal to each other and will increase and decrease simultaneously and to substantially the same extent in response to increases and decreases respectively in the level of the D.C. signal applied to the base of transistor TR2. In the event that transistors TR3 and TR4 are not perfectly matched, resistor R4 may be adjusted to compensate for the mismatching to obtain the lowest possible distortion. The net result is that the resistances of transistors TR3 and TR4 vary simultaneously and in the same direction and are kept equal to each other. Thus, the D.C. voltages developed across resistors R3 and R4, i.e., across the base-emitter junctions of transistors TR3 and TR4, result in conduction of these transistors, and they function as variable resistors that attenuate the output signal of preamplifier 10, it being understood that from an A.C. point of view terminal 18 is at essentially ground potential because of the low impedance of the power supply.

Figure 4:
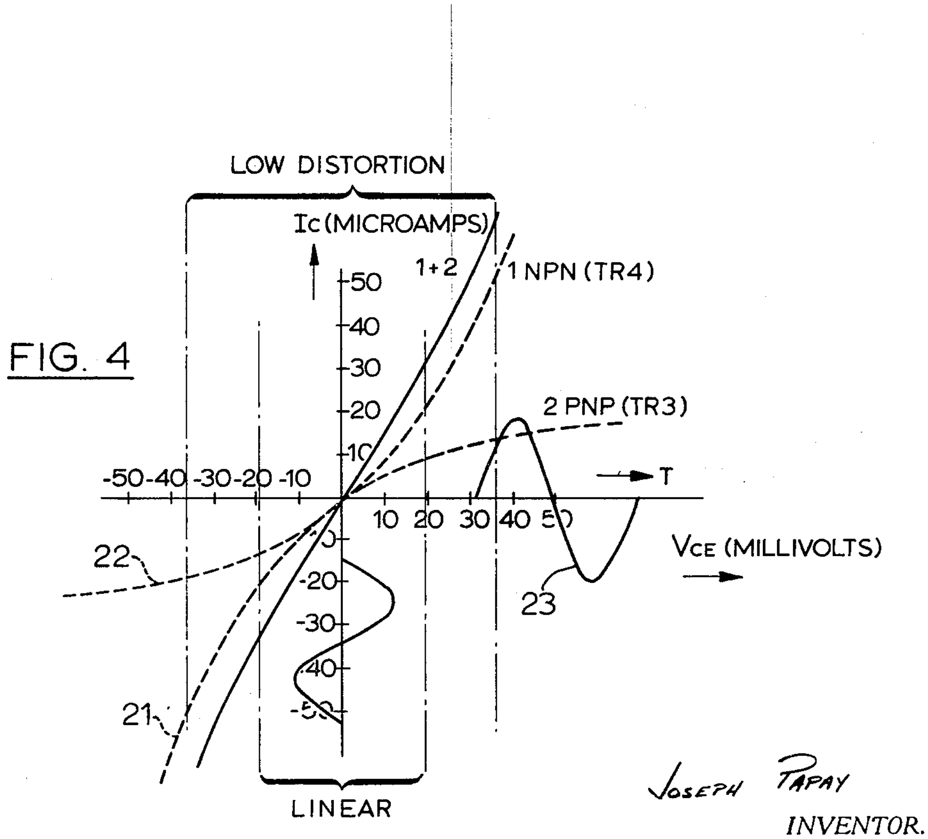
FIG. 4 shows the characteristic curves of the collector-emitter junctions of the two transistors of FIG. 3 that are substituted for the single transistor of FIG. 1.

The characteristic curves of the collector-emitter junctions of transistors TR3 and TR4 are shown at 21 and 22 in FIG. 1. The undistorted signal in the conductor connecting capacitors C2′ and C2″ to terminal 12 is shown at 23 in FIG. 4.

While a preferred embodiment of this invention has been disclosed herein, those skilled in the art will appreciate that changes and modifications may be made therein without departing from the spirit and scope of this invention as defined in the appended claims.

What I claim as my invention is:

1. In combination with an amplifier having an input terminal for receiving an input signal and an output terminal at which an output signal is derived, an automatic gain control network connected between said input and output terminals, said automatic gain control network comprising means for rectifying a part of the output signal of said amplifier to provide a D.C. signal that varies with the magnitude of said output signal, first and second complementary transistors of opposite conductivity types each having input, output and common electrodes, first and second attenuating networks having substantially the same A.C. impedance connected to said input terminal for attenuating said input signal in response to an increase in said output signal beyond a predetermined level, said first attenuating network including said output and common electrodes of said first transistor, said second attenuating network including said output and common electrodes of said second transistor, said transistors being A.C. connected in parallel and both in the same common electrode configuration, and means for deriving from said D.C. signal and for applying to said input electrodes of said first and second transistors respectively first and second signals respectively that simultaneously vary the resistances of said first and second transistors respectively in the same direction and to substantially the same extent.

2. The invention according to claim 1 wherein said means for deriving said first and second signals comprises a third transistor having base, collector and emitter electrodes, first and second resistors and a source of D.C. potential having two terminals, said first resistor being connected between one of said terminals of said source and said emitter electrode of said third transistor, said second resistor being connected between the other terminal of said source and said collector electrode of said third transistor, said D.C. signal being applied to said base electrode of said third transistor.

3. The invention according to claim 2 wherein one of said resistors is variable.

4. The invention according to claim 2 wherein said input electrodes are base electrodes, said output electrodes are collector electrodes and said common electrodes are emitter electrodes, said first and second resistors being connected between said base and emitter electrodes of said first and second transistors respectively.

5. The invention according to claim 4 wherein each of said networks for attenuating said input signal includes a coupling capacitor connected between said input terminal of said amplifier and said collector electrodes of said first and second transistors.

6. The invention according to claim 5 wherein one of said resistors is variable.

* * * * *